(12) United States Patent
Berger et al.

(10) Patent No.: US 11,231,490 B2
(45) Date of Patent: Jan. 25, 2022

(54) LASER POWER CAILIBRATION AND CORRECTION

(71) Applicant: Zoox, Inc., Foster City, CA (US)

(72) Inventors: Adam Berger, Mountain View, CA (US); Ryan McMichael, Mountain View, CA (US); Riley Andrews, San Francisco, CA (US); Denis Nikitin, Campbell, CA (US); Brian Pilnick, East Palo Alto, CA (US)

(73) Assignee: Zoox, Inc., Foster City, CA (US)

( * ) Notice: Subject to any disclaimer, the term of this patent is extended or adjusted under 35 U.S.C. 154(b) by 0 days.

(21) Appl. No.: 16/947,137

(22) Filed: Jul. 20, 2020

(65) Prior Publication Data
US 2020/0348404 A1    Nov. 5, 2020

Related U.S. Application Data

(63) Continuation of application No. 16/100,757, filed on Aug. 10, 2018, now Pat. No. 10,718,857, which is a
(Continued)

(51) Int. Cl.
*G01S 7/497* (2006.01)
*G01S 7/486* (2020.01)
(Continued)

(52) U.S. Cl.
CPC .............. *G01S 7/497* (2013.01); *G01S 7/484* (2013.01); *G01S 7/4868* (2013.01); *G01S 17/06* (2013.01);
(Continued)

(58) Field of Classification Search
CPC ........ G01S 7/497; G01S 7/4865; G01S 7/003; G01S 17/06; G01S 17/26; H01S 5/06216
See application file for complete search history.

(56) References Cited

U.S. PATENT DOCUMENTS

| 3,790,277 A | 2/1974 | Hogan |
| 4,154,529 A | 5/1979 | Dyott |

(Continued)

FOREIGN PATENT DOCUMENTS

| EP | 2410358 A1 | 1/2012 |
| JP | H0412289 A | 1/1992 |

(Continued)

OTHER PUBLICATIONS

U.S. Appl. No. 14/462,075, filed Aug. 18, 2014, Pennecot et al., "Devices and Methods for a Rotating LIDAR Platform with a Shared Transmit/Receive Path," 55 pages.
(Continued)

*Primary Examiner* — Maurice C Smith
(74) *Attorney, Agent, or Firm* — Lee & Hayes, P.C.

(57) ABSTRACT

A LIDAR system emits laser pulses, wherein each pulse is associated with a power level. A laser emitter is adjusted during operation of a LIDAR system using power profile data associated with the laser. The power profile data is obtained during a calibration procedure and includes information that associates charge duration for a laser power supply with the actual power output by laser. The power profiles can be used during operation of the LIDAR system. A laser pulse can be emitted, the reflected light from the pulse received and analyzed, and the power of the next pulse can be adjusted based on a lookup within the power profile for the laser. For instance, if the power returned from a pulse is too high (e.g., above some specified threshold), the power of the next pulse is reduced to a specific value based on the power profile.

20 Claims, 10 Drawing Sheets

Related U.S. Application Data continuation of application No. 15/487,170, filed on Apr. 13, 2017, now Pat. No. 10,048,358.

(60) Provisional application No. 62/440,734, filed on Dec. 30, 2016.

(51) Int. Cl.
*G01S 17/10* (2020.01)
*H01S 5/0683* (2006.01)
*H01S 5/042* (2006.01)
*H01S 5/062* (2006.01)
*G01S 17/42* (2006.01)
*G01S 7/484* (2006.01)
*G01S 17/06* (2006.01)

(52) U.S. Cl.
CPC ............. *G01S 17/10* (2013.01); *G01S 17/42* (2013.01); *H01S 5/0428* (2013.01); *H01S 5/0683* (2013.01); *H01S 5/06216* (2013.01)

(56) References Cited

U.S. PATENT DOCUMENTS

| | | | |
|---|---|---|---|
| 4,516,158 A | 5/1985 | Grainge et al. | |
| 4,700,301 A | 10/1987 | Dyke | |
| 4,709,195 A | 11/1987 | Hellekson et al. | |
| 5,098,185 A | 3/1992 | Watanabe et al. | |
| 5,202,742 A | 4/1993 | Frank et al. | |
| 5,303,084 A | 4/1994 | Pflibsen et al. | |
| 5,337,189 A | 8/1994 | Krawczyk et al. | |
| 5,428,438 A | 6/1995 | Komine | |
| 5,633,706 A | 5/1997 | Cho et al. | |
| 5,703,351 A | 12/1997 | Meyers | |
| 5,953,109 A | 9/1999 | Lai et al. | |
| 6,046,800 A | 4/2000 | Ohtomo et al. | |
| 6,115,128 A | 9/2000 | Vann | |
| 6,415,241 B1 | 7/2002 | Yoshida | |
| 6,778,732 B1 | 8/2004 | Fermann | |
| 7,089,114 B1 | 8/2006 | Huang | |
| 7,248,342 B1 | 7/2007 | Degnan | |
| 7,255,275 B2 | 8/2007 | Gurevich et al. | |
| 7,259,838 B2 | 8/2007 | Carlhoff et al. | |
| 7,311,000 B2 | 12/2007 | Smith et al. | |
| 7,361,948 B2 | 4/2008 | Hirano et al. | |
| 7,417,716 B2 | 8/2008 | Nagasaka et al. | |
| 7,486,386 B1 | 2/2009 | Holcombe et al. | |
| 7,544,945 B2 | 6/2009 | Tan et al. | |
| 7,969,558 B2 | 6/2011 | Hall | |
| 8,050,863 B2 | 11/2011 | Trepagnier et al. | |
| 8,477,290 B2 | 7/2013 | Yamada | |
| 8,675,181 B2 | 3/2014 | Hall | |
| 8,742,325 B1 | 6/2014 | Droz et al. | |
| 8,767,190 B2 | 7/2014 | Hall | |
| 8,836,922 B1 | 9/2014 | Pennecot et al. | |
| 9,086,273 B1 | 7/2015 | Gruver et al. | |
| 9,285,464 B2 | 3/2016 | Pennecot et al. | |
| 9,368,936 B1 | 6/2016 | Lenius et al. | |
| RE46,672 E | 1/2018 | Hall | |
| 2002/0140924 A1 | 10/2002 | Wangler et al. | |
| 2004/0135992 A1 | 7/2004 | Munro | |
| 2008/0316463 A1 | 12/2008 | Okada et al. | |
| 2009/0274185 A1 | 11/2009 | Champion | |
| 2010/0220141 A1 | 9/2010 | Ozawa | |
| 2010/0302528 A1 | 12/2010 | Hall | |
| 2011/0100967 A1 | 5/2011 | Yoo et al. | |
| 2011/0216304 A1 | 9/2011 | Hall | |
| 2011/0255070 A1 | 10/2011 | Phillips et al. | |
| 2015/0293228 A1 | 10/2015 | Retterath et al. | |
| 2015/0300878 A1 | 10/2015 | Cobler et al. | |
| 2016/0047901 A1 | 2/2016 | Pacala et al. | |
| 2016/0061941 A1 | 3/2016 | Guo et al. | |
| 2018/0188360 A1 | 7/2018 | Berger et al. | |

FOREIGN PATENT DOCUMENTS

| | | |
|---|---|---|
| JP | 2016127214 | 7/2016 |
| JP | 2016152336 | 8/2016 |
| WO | WO03073123 | 9/2003 |
| WO | WO2008008970 | 1/2008 |
| WO | WO2012172526 A1 | 12/2012 |

OTHER PUBLICATIONS

Efficient Power Conversion, Why GaN circuits make better Lidar, retrieved on Mar. 3, 2017 at «http://epc-co.com/epc/DesignSupport/TrainingVideos/eGaNDemos/GaN-circuits-make-better-LiDAR.aspx» 2 pages.

Khaled, Elsayed "Design and construction of Q-switched ND:YAG laser system for LIBS meansurements", Optics & Laser Technology, Jul. 6, 2011.

Notice of Allowance from the U.S. Patent and Trademark Office for U.S. Appl. No. 14/462,075, dated Nov. 18, 2015. 8 pages.

Office Action from the U.S Patent and Trademark Office ofr U.S. Appl. No. 14/462,075, dated Jun. 17, 2015. 14 pages.

PCT Search Report and Written Opinion dated Apr. 5, 2018 for PCT application No. PCT/US2017/068280, 17 pages.

PCT Search Report and Written Opinion dated Nov. 19, 2014 for PCT Application No. PCT/US2014/047864, 12 pages.

Rim et al., "The optical advantages of curved focal plane arrays," Optics Express, vol. 16, No. 7, Mar. 31, 2008, 7 pages.

Xu et al., "A calibration method of the multi-channel imaging lidar," Proceedings SPIE 9080, Laser Radar Technology and Applications XIX; and Atmospheric Propagation XI, 90800V, Jun. 9, 2014, 2 pages.

Eurpoean Office Action dated Oct. 8, 2021 for European Patent Application No. 17832666.6-1206, a foreign counterpart to U.S. Pat. No. 10,048,358, 6 pages.

Japanese Office Action dated Sep. 28, 2021 for Japanese Patent Application No. 2019-556543, a foreign counterpart to U.S. Pat. No. 10,048,358, 11 pages.

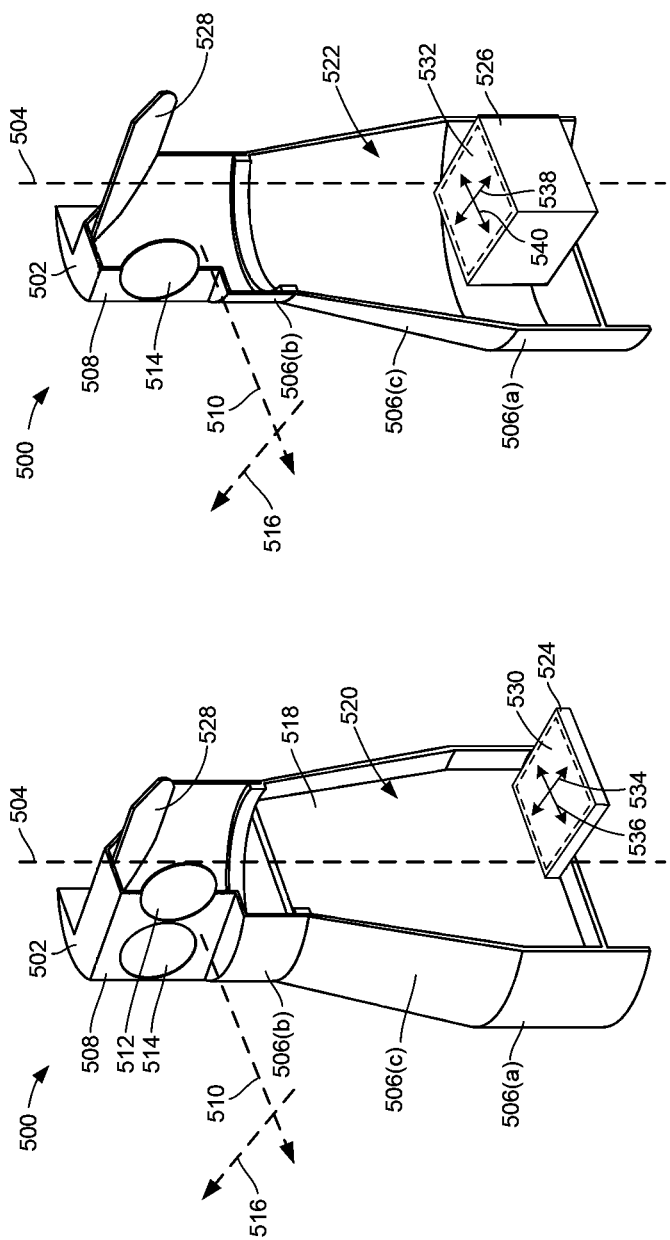

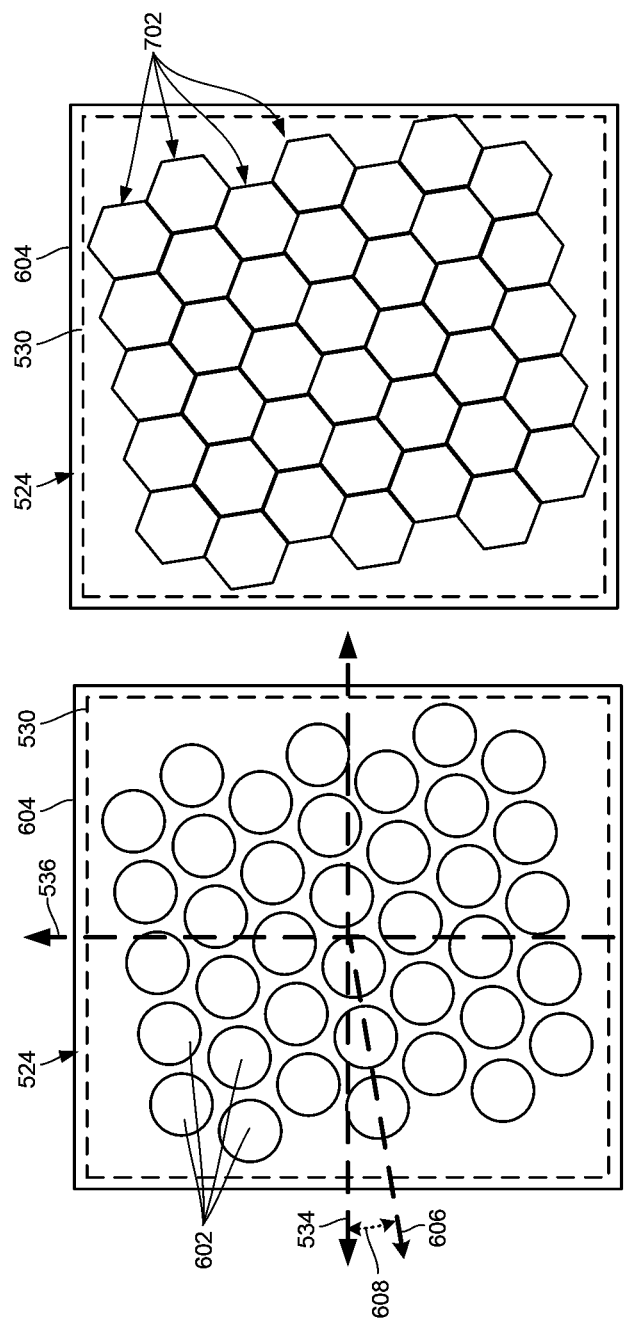

LASER POWER CAILIBRATION AND CORRECTION

RELATED APPLICATIONS

This is a continuation application which claims priority to commonly assigned, co-pending U.S. patent application Ser. No. 16/100,757, filed Aug. 10, 2018, U.S. patent application Ser. No. 15/487,170, filed Apr. 13, 2017, which claims priority to U.S. Provisional Application No. 62/440,734, filed Dec. 30, 2016. U.S. patent application Ser. No. 16/100, 757, U.S. patent application Ser. No. 15/487,170 and U.S. Provisional Application No. 62/440,734 are fully incorporated herein by reference.

BACKGROUND

"LIDAR" refers to a technique for measuring distances of visible surfaces by emitting light and measuring properties of the reflections of the light. The term "LIDAR" is an acronym for "Light Detection and Ranging" and is sometimes referred to as "laser scanning" or "3D scanning." In some cases, a LIDAR system includes multiple laser emitters and/or multiple light sensors. Alternatively, or in addition, a LIDAR system may physically move one or more lasers and/or sensors to scan over a scene while repeatedly taking measurements of different surface points.

Generally, the light emitter may comprise a laser that directs highly focused light in the direction of an object or surface. The light sensor may comprise a photodetector such as a photomultiplier or avalanche photodiode (APD) that converts light intensity to a corresponding electrical signal. Optical elements such as lenses may be used in the light transmission and reception paths to focus light, depending on the particular nature of the LIDAR system.

A LIDAR system has signal processing components that analyze reflected light signals to determine the distances to surfaces from which the emitted laser light has been reflected. For example, the system may measure the "flight time" of a light signal as it travels from the laser, to the surface, and back to the light sensor. A distance is then calculated based on the flight time and the known speed of light.

LIDAR systems can be used to inform guidance, navigation, and control systems such as may be used in autonomous vehicles. In systems such as this, one or more LIDAR devices are configured to produce a surface map indicating the 3D coordinates of visible surface points surrounding the vehicle. A guidance, navigation, and control system analyzes this data to identify obstacles, to perform obstacle avoidance, and to determine a desired path of travel. Developing and creating LIDAR systems that are both accurate and have the desired resolution for a particular application can be costly and challenging.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIGS. 5A and 5B illustrate an example configuration of a rotatable sensor assembly that may be used as part of a LIDAR sensor device or system.

FIG. 6 is a representational top view of an example light sensor that may be used in the LIDAR assembly of FIGS. 5A and 5B.

FIG. 7 is a representational top view of the example light sensor, illustrating an example packing arrangement.

DETAILED DESCRIPTION

Figure 1:
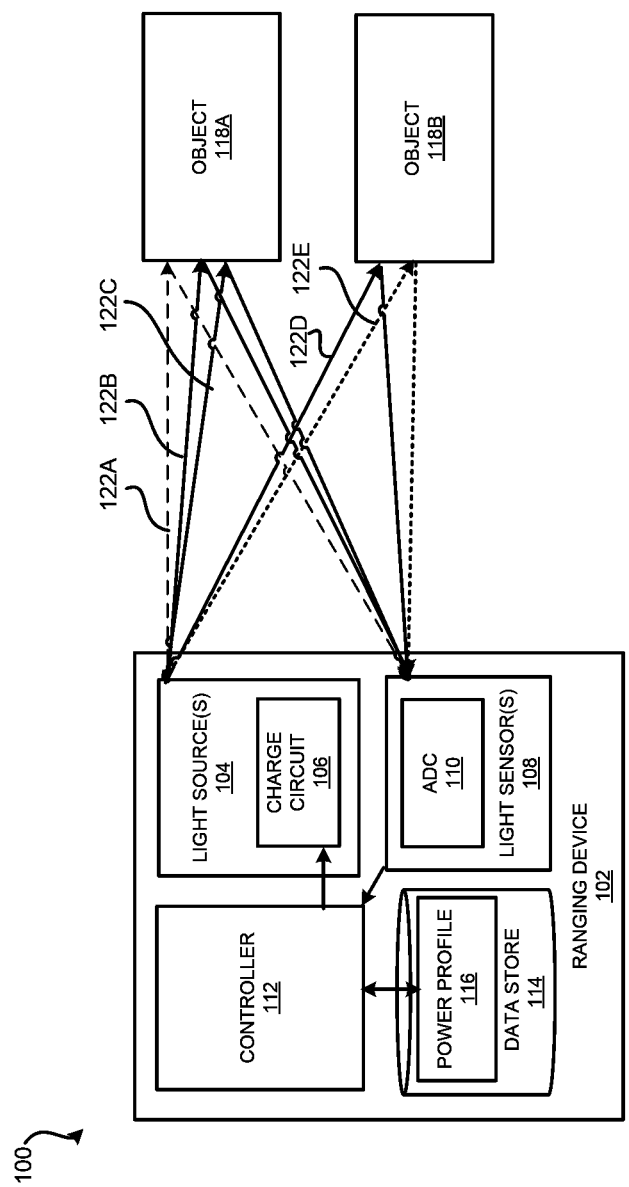
FIG. 1 illustrates an example of a laser power calibration and correction system.

The following detailed description is directed to technologies for laser power calibration and correction. Techniques are described herein for generating a power profile for a laser light source and then using the power profile to adjust the power of emitted light pulses during operation. The power profile is accessed to determine a charging time that will cause the light source to generate and emit a light pulse at a specified power level. In contrast to slowly changing the power of an emitted light pulse, techniques described herein use a charge duration stored within one or more power profiles to generate the light pulse at the desired power level. In this way, the power of each subsequently emitted light pulse can be adjusted to have the desired power level.

The power profile includes data that indicates the average power output by the laser light source at different charging durations. In some configurations, instead of using a single power profile to represent the lasers within a LIDAR system, a separate power profile is generated for each laser within the LIDAR system. For instance, when thirty eight laser emitters are used within a LIDAR system, a power profile for each laser emitter is generated. In this way, differences between the physical components utilized in each of the laser emitters of the LIDAR system can be better accounted for as compared to using a representative power profile for the lasers of the LIDAR system.

In some examples, the power profiles are determined during a calibration cycle that can be performed before or after deploying the LIDAR system. During a calibration cycle, a laser emitter is aimed at a reference surface. Generally, the reference surface is at a specified distance from the laser emitter and has known reflective properties. As discussed briefly above, the power profile for each laser emitter includes the average power of light pulses emitted by the laser emitter using different charge times. The number of charge durations and corresponding power values included within a power profile can change between different applications. For instance, some applications can include five pairs of values whereas another application can have twenty or more pairs of values. Generally, the more data recorded within the power profile, the more finely the power output of the laser emitter can be controlled within the LIDAR system. After charging the charge circuit for the determined charge duration, a capacitive circuit drives the laser emitter to produce an output light pulse. Thousands of different light pulses can be generated using each of the different charge durations in order to obtain an accurate power of the laser at the specific charge time.

After generating the power profiles, information from the power profiles can be used during operation of the LIDAR system. For example, a laser pulse can be generated, the reflected light from the pulse received and analyzed, and the power of the next pulse can be adjusted based on a lookup within the power profile for the laser. For instance, if the power returned from a pulse is too high (e.g., above some specified threshold), the power of the next pulse can be reduced to a specific value based on the power profile. Similarly, if the power returned from a pulse is too low (e.g., below some specified threshold), the power of the next pulse can be increased to a specific value based on the power profile. When the power returned by a pulse is too high or too low, the range data can be inaccurate. For example, an ADC used by the LIDAR system may not be configured to accurately represent the reflected pulse.

Instead of having to successively adjust a charge time of a laser to slowly converge toward a desired power level, the power profile specifies the corrected charge duration for the desired power level for the next laser pulse. As such, a successive laser light pulse can be emitted such that the power of the reflected light is within a desired range. Additionally, the power used by the LIDAR system is reduced since the LIDAR system does not always stay at the same power level, or slowly converge toward a specified power level.

According to some examples, the LIDAR system includes laser emitters, light sensors, analog to digital converters (ADCs) and power supplies mounted in a chassis that rotates about a vertical rotational axis to scan horizontally across a scene. During a rotation of the chassis, laser light pulses are emitted at different vertical directions and at different horizontal directions. The vertical angle of light emission is varied by using lasers that are at different positions within the chassis. The horizontal angle of light emission varies with the rotation of the chassis. The apparatus has one or more lenses that define a field of view of a scene surrounding the apparatus. As the chassis rotates, the field of view moves or scans horizontally. More details are provided below with regard to FIGS. 1-10.

FIG. 1 illustrates an example of a laser power calibration and correction system. As shown, system 100 includes a ranging device 102 that comprises one or more laser light source(s) 104, a charge circuit 106, sensor(s) 108, analog-to-digital converter (ADC) 110, controller 112, and data store 114 that stores power profile 116.

In the current example, the ranging device 102 is configured to generate three-dimensional coordinates of surfaces that are visible from the perspective of the laser light source(s) 104. In some examples, the ranging device 102 can be used by guidance, navigation, and control systems of autonomous vehicles such automobiles, aircraft, boats, etc. The ranging device can also be used in other applications that have a need for real-time, multi-point, scanning distance measurements. The laser light source(s) can include one or more laser emitters, such as the example ranging device illustrated in FIGS. 5-10.

The system 100 has a controller 112 that implements control and analysis logic for the ranging device 102. The controller 112 may be implemented in part by an FPGA (field-programmable gate array), a microprocessor, a DSP (digital signal processor), or a combination of one or more of these and other control and processing elements, and may have associated memory for storing associated programs and data.

To initiate a single distance measurement, the controller 112 instructs the charge circuit 106 to charge for a specified charge duration. The signal generated by the charge circuit is used by the laser light source to generate a light pulse. In some examples, the controller 112 causes the charge circuit 106 to charge one or more capacitors for the specified charge duration. After charging for the specified period of time, the controller 112, or some other component can cause the laser light source 104 to generate and emit a light pulse at a power level that is related to the charge time of the charge circuit 106.

As illustrated, for a single distance measurement, the laser light source 104 is controlled by the controller 112 to emit one or more laser light pulses along an outward path. In the current example, the laser light source 104 emits a first pulse 122A that hits object 118A. Assuming that the emitted laser light is reflected from the object 118A, the sensor 108 receives the reflected light and produces a return signal used by the ADC 110 to generate a digital representation of the signal.

The return signal is generally of the same shape as the light pulse generated by the laser light source 104, although it may differ to some extent as a result of noise, interference, cross-talk between different emitter/sensor pairs, interfering signals from other LIDAR devices, and so forth. The return signal will also be delayed with respect to the light pulse emitted by the laser light source 104 by an amount corresponding to the round-trip propagation time of the emitted laser pulse. The ADC 110 receives and digitizes the return signal to produce a digitized return signal that is a stream of digital values indicating the magnitude of the return signal over time.

According to some configurations, the controller 112 adjusts the charge duration of the charge circuit 106 during operation of the ranging device 102 in order to adjust for the different reflective properties of different objects that a laser light pulse may hit. For instance, object 118A may not reflect as much light as object 118B. As such, the signal received by the sensor 108 in response to a light pulse reflecting off object 118A may not be of sufficient strength to generate an accurate distance to the object 118A. Similarly, if an object, such as object 118B reflects too much light, the magnitude of the return signal may not be correctly identified by the ADC 110. As a result, the accuracy of the range measurement can also be reduced. In order to obtain more accurate results, in some examples, the controller 112 is configured to adjust the power of a subsequent light pulse such that the power of the light pulse is within a predetermined range. The power consumption and eye safety of the LIDAR system is also improved since the power is reduced in some situations and in other situations the laser power is limited. In this way, the return signal generated from the light pulse reflecting off of an object will fall within the predetermined range and the accuracy of the LIDAR system is improved. In other configurations, the power of the laser light source is limited by an eye safe power level. For example, the laser light source can be an American National Standards Institute (ANSI) level 1 laser such that the maximum power generated by the laser light source is still eye safe.

In order to further clarify, a non-limiting example will be presented. In the current example, the first light pulse 122A is identified by the controller 112 to fall below a desired power level (e.g., as set by an authorized user/operator of the ranging device 102). In response to determining that the power level is below the desired power level, the controller 112 instructs the charge circuit 106 to charge for a charge duration that is associated with the desired power level. In contrast to slowly changing the charging time to reach the desired power level, the controller 112 accesses the power profile 116 within data store 114 to determine the charge duration of the charge circuit 106 to produce a light pulse at the desired power level. In this way, the power of the emitted light pulse can often times be adjusted before the laser moves to another object within the environment. Generally, the power profile 116 includes data that indicates the average power output by the laser at different charging times. In some examples, the power profile 116 correlates capacitor charge energy with emitted laser intensity for each of the different lasers in the LIDAR system.

According to some examples, average power values for different charge times for each light source 104 of a ranging device 102 is tested during one or more calibration cycles of the ranging device 102. In some configurations, the power values of each light source 104 are tested at different charge times. For example, the controller 112 may emit light pulses using the same charge duration for a period of time and average the power of the light emitted by the light source. After recording the charge duration and the average power within the power profile 116, the controller 112 can use a different charge time to obtain a different power value. The controller 112, or some other component, can perform this operation for many different charge durations (e.g., 1 μs, 2 μs ... N μs).

As briefly discussed, instead of using a single power profile as a representative power profile for all of the laser light sources 104 within a LIDAR system, a separate power profile can be generated and stored for each laser within the LIDAR system. For instance, when thirty eight laser emitters are used (or some other number of laser emitters are used), a power profile for each laser emitter is generated. In this way, differences between the physical components utilized in each of the lasers of the LIDAR system can be better accounted for as compared to using a representative power profile for the lasers of the LIDAR system. For example, the charging time needed to generate a light pulse at a desired power level can vary based on the location of the laser emitter within the LIDAR system, the differences between capacitors, inductors and/or other electronic components utilized to generate a pulse, and the like. In some examples, the power profile is associated with the associated charge circuit 106 and the associated light source 104.

During a calibration cycle, a laser light source 104 is aimed at a reference surface. Generally, the reference surface is at a specified distance from the laser emitter and has known reflective properties. As discussed briefly above, the power profile for each laser emitter includes the average power of light pulses emitted by the laser emitter using different charge times. The number of charge times and corresponding power values included within a power profile 114 can change between different applications. For instance, some applications can include five pairs of values whereas another application can have twenty or more pairs of values. Generally, the more data recorded within the power profile 116, the more finely the power output of the laser emitter can be controlled. After charging the charge circuit 106 for the determined charge time, the stored charge is used to generate an output light pulse. Thousands of light pulses can be generated using each of the different charge times in order to obtain an accurate power of the laser at the specific charge time.

Returning to the above example, after the controller 112 determines to adjust the power of a subsequent light pulse to a specified value (or within an acceptable range), the controller 112 accesses the power profile 116 associated with the light source 104 to determine the charge duration. In some examples, the controller 112 identifies the power value associated with a midpoint of the digital representation of the return signal and determines the value of the charge duration associated with the midpoint. In this way, a reflected signal that is higher or lower than expected may still be within an acceptable range. Once the charge duration for the desired power level is determined, the controller 112 charges the charge circuit 106 for the specified duration and then causes the subsequent light pulse 122B to be emitted. For purposes of illustration, the dashed lines 122A and 122E indicate a lower power as compared to the solid lines 122B-122D.

The controller 112 can be configured to determine whether to adjust the power for each emitted light pulse, for every Nth pulse, or use some other metric in determining when to adjust the power of the light source. In the current example, the controller 112 determines that the return signal is within range until receiving the reflected light from 122D. For example, the object 118B may have a higher reflectivity as compared to object 118A, and as such the controller 112 determines to decrease the power of the light pulse 122E.

Figure 2:
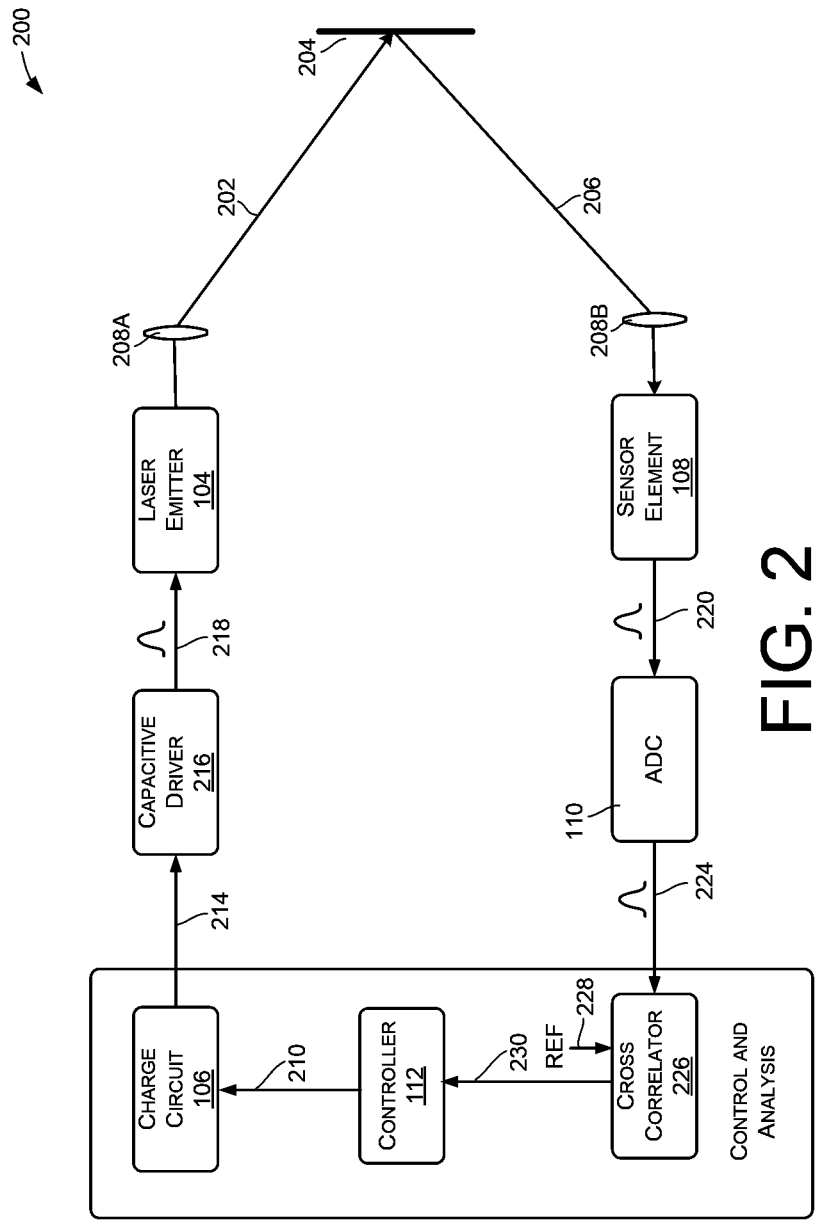
FIG. 2 illustrates logical elements of an example LIDAR distance measurement system that may be used to perform distance or ranging measurements.

FIG. 2 illustrates logical elements of a LIDAR distance measurement system 200 that may be used to perform distance or ranging measurements. While one measurement channel is illustrated, a LIDAR system can include many different measurement channels.

A measurement channel includes one laser light source, such as laser emitter 104 and a corresponding sensor element 108. For a single distance measurement, the laser emitter 104 is controlled to emit one or more laser light pulses through the lens 208A along an outward path 202. The burst is reflected by a surface 204 of a scene, through the lens 208B, and to the sensor element 108 along a return path 206.

The lens 208B is designed so that beams from laser emitters at different physical positions within the ranging device 102 are directed outwardly at different angles. Specifically, the lens 208B is designed to direct light from the laser emitter 104 of a particular channel in a corresponding and unique direction. The lens 208A is designed so that the corresponding sensor element 108 of the channel receives reflected light from the same direction.

The system 200 has a controller 112 that implements control and analysis logic for multiple channels. To initiate a single distance measurement using a single channel, the controller 112 generates a signal 210. The signal 210 is received by the charge circuit 106. In response to receiving the signal 210, the charge circuit 106 provides signal 214 to charge the capacitive driver 216 for a specified duration.

After charging for the specified duration, the capacitive driver 216 provides an emitter drive signal 218. The emitter drive signal 218 is connected to the laser emitter 104 to pulse the laser emitter 104 and to produce a pulse of laser light.

Assuming that the emitted laser light is reflected from the surface 204, the sensor element 108 receives the reflected light and produces a return signal 220. The return signal 220 is generally of the same shape as the emitter drive signal 218, although it may differ to some extent as a result of noise, interference, cross-talk between different emitter/sensor pairs, interfering signals from other LIDAR devices, and so forth. The return signal 220 will also be delayed with respect to the emitter drive signal 218 by an amount corresponding to the round-trip propagation time of the emitted laser burst.

The ADC 110 receives and digitizes the return signal 220 to produce a digitized return signal 224. The digitized return signal 224 is a stream of digital values indicating the magnitude of the return signal 220 over time.

A cross-correlation component 226 receives the digitized return signal 224 and performs a cross-correlation between the digitized return signal 224 and a reference waveform 228, to produce a cross-correlation signal 230. In some configurations, the function of the cross-correlation component 226 may be performed by the controller 112. In other examples, other mechanisms can be used to perform pulse detection.

The reference waveform 228 represents the timing and the intensity of the light that is actually emitted by the laser emitter 104. In certain examples, the reference waveform 228 may be obtained during a calibration cycle. For example, in some examples there may be a reference surface at which the output of the laser emitter can be aimed. The reference surface may be at a known, relatively small distance from the lenses 208A and 208B. When the output of the laser emitter 104 is directed toward the reference surface, the capacitive driver 216 drives the laser emitter 104 to produce an output burst. The sensor element 108 and the ADC 110 are then used to capture a waveform corresponding to the light reflected from the reference surface. This captured waveform may be used as the reference waveform 228. The reference waveform 228 may be captured uniquely for each channel, may be stored and used for multiple subsequent measurements, and may be updated over time to account for thermal drift and/or other variables. In some examples, the reference waveform 228 may be updated at least once per revolution of the chassis.

In other examples, one or more different sensors may be used to capture the reference waveform 228 during one or more calibration emissions of the laser emitter 104. Furthermore, multiple readings may be performed and averaged to create the reference waveform 228.

The controller 112 receives the cross-correlation signal and detects and/or analyzes the cross-correlation signal 230 and possibly one or more other signals, such as the digitized signal 224. The controller can determine the magnitude of the signal 230 as well as determine to find its highest peak, which indicates the phase difference or time shift between the light pulses as emitted from the laser emitter 104 and as received at the sensor element 108. The controller 112 can also determine if the power of the return signal is within an acceptable range (i.e., not too high or low).

Figure 3:
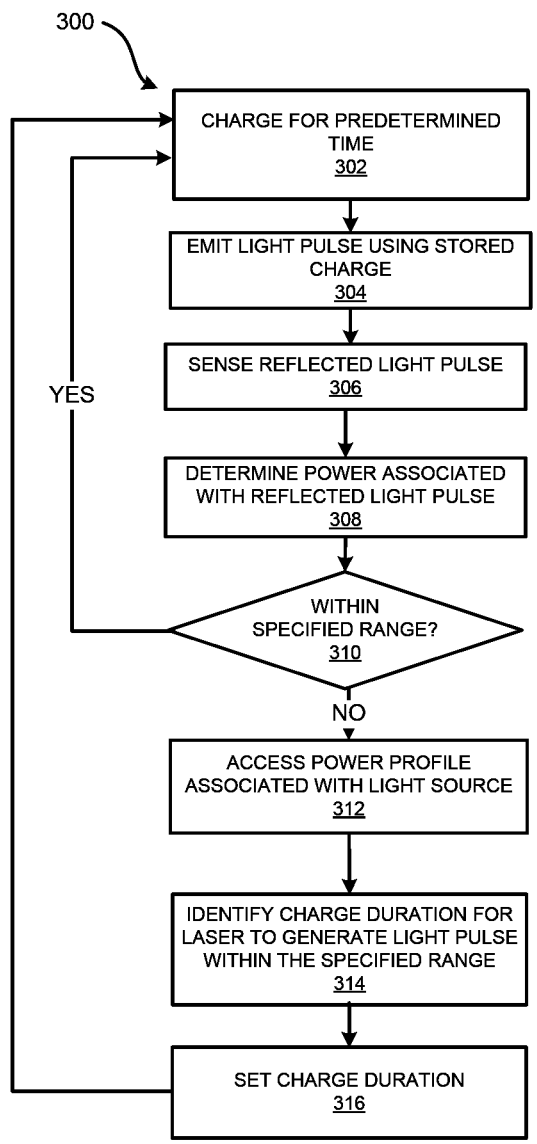
FIG. 3 shows an example process for adjusting the charging time of a laser light emitter to generate a light pulse at a specified power level.
Figure 4:
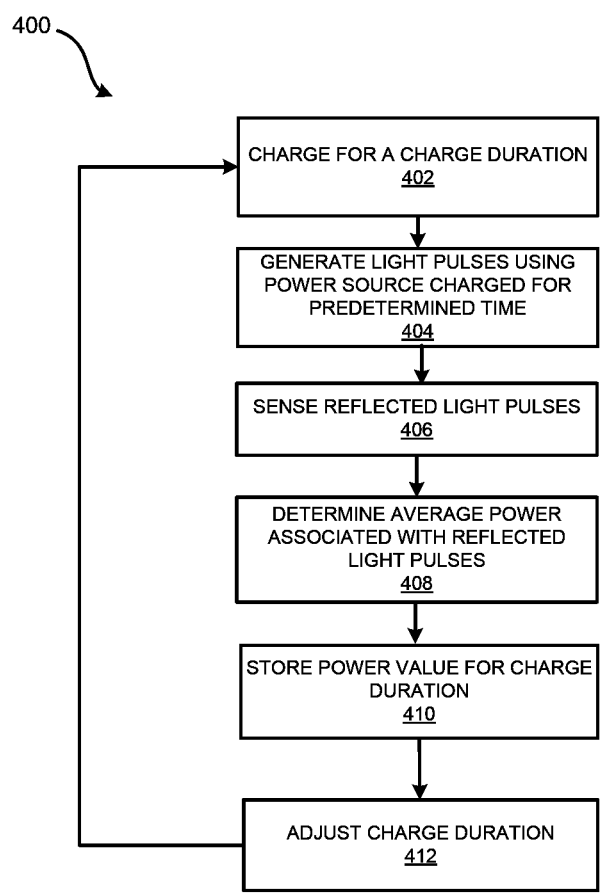
FIG. 4 shows an example process for generating a power profile for a laser light emitter.

FIGS. 3 and 4 show example processes for laser power calibration and adjustment. The example processes will be described as being performed in an environment having one or more LIDAR measurement channels, which are used to perform respective distance measurements. In the described examples, each measurement channel comprises a charging circuit 106 powering a laser emitter 104 and a corresponding light sensor 108. The laser emitters and sensors may be arranged as described herein or in various different ways. In the environment described herein, any of the actions described can be performed, controlled, or supervised at least in part by the controller 112 referenced in FIGS. 1 and 2.

FIG. 3 shows an example process 300 for adjusting the charging time of a laser light emitter to generate a light pulse at a specified power level. An action 302 comprises charging a charge circuit 106 for the predetermined time. As described herein, one or more capacitors can be part of a charge circuit 106 that is used by a light source 104 to emit a laser light pulse. Generally, the longer the charge duration, the more power for an emitted light pulse.

An action 304 comprises generating and emitting one or more light pulses using the stored charge. In some examples more than one light pulse can be emitted. When the emitted burst include more than one light pulse, the pulses separated in time by a time interval having a duration.

An action 306 comprises sensing a reflected light pulse corresponding to an emitted light pulse. This action is performed by the sensor element 108 of the channel corresponding to the laser emitter 104 from which the emitted light pulse originated.

An action 308 comprises determining a power associated with the reflected light pulse. In some configurations, the action 308 includes digitizing a signal produced by the sensor element 108 to produce a digitized return light signal. The digitizing is performed by the ADC 110 associated with the channel.

An action 310 comprises determining whether the power of the reflected light is within a specified range. As discussed above, the specified power level can be a single value or a range of values. In some configurations, the specified power level is set to a value that is at or near the midpoint of a resolution of the ADC 110. Higher or lower values can be utilized. When the power is within the specified range, the process 300 flows to action 302 where the same charging time can be utilized for generating the next light pulse. When the power is not within the specified range, the process 300 flows to action 312.

An action 312 comprises accessing a power profile associated with a light source. As described above, the power profile 116 includes data that indicates the average power associated with light pulses emitted by the laser using different charging times. In some configurations, the power profile 116 can be stored in a data store 114, or some other memory.

An action 314 comprises identifying a charge duration for the laser that results in an emitted light pulse at the specified range. In some examples, the controller 112 performs a look up operation that locates the specified power within the power profile 116 (or a value near the specified power level) and identifies the associated charge duration.

An action 316 comprises setting the charge duration to the time identified from the power profile. The process 300 can then return to action 302.

FIG. 4 shows an example process 400 for generating a power profile for a laser light emitter. An action 402 comprises charging the charge circuit 106 of a laser light source 104 for a charge duration. As described herein, one or more capacitors can be part of a charge circuit 106 that is used by a light source 104 to emit a laser light pulse.

An action 404 comprises generating and emitting light pulses using the charge circuit 106 charged to the charge duration. As described above, the laser light source 104 can be controlled by the controller 112 to generate light pulses using the same charge duration for a specified period of time.

An action 406 senses the reflected light pulses. As described above, the sensor element 108 senses the reflected light pulses corresponding to the emitted light pulses.

An action 408 comprises determining an average power associated with the reflected light pulses. In some configurations, the action 408 includes digitizing, using the ADC 110, the signals produced by the sensor element 108 to produce digitized return light signals. The average power level associated with the pulses can be determined by dividing the total power by the number of pulses emitted by the laser light source 104.

An action 410 comprises storing the power value for the charge duration within a power profile associated with the laser light source 104. As described above, the power profile can include many different pairs of charge durations and average power values.

An action 412 comprises adjusting the charge duration. For example, the charge duration can be incremented/decremented some set amount (e.g. +−5 μs, 10 μs, . . . ). The process 400 can then return to action 402.

FIGS. 5A and 5B illustrate an example configuration of a rotatable sensor assembly 500 that may be used as part of a LIDAR sensor device or system.

The sensor assembly 500 comprises a chassis 502 that rotates about a rotational axis 504. In certain examples, the rotational axis is vertical. In other examples, the rotational axis may be tilted from vertical or may be in any orientation that is suitable for the particular environment in which the sensor assembly 500 is being used.

The chassis 502 has an outer contour that is generally symmetrical about the rotational axis 504. The chassis 502 has a lower section 506(a) having a cylindrical outer contour, an upper section 506(b) having a cylindrical outer contour, and a middle section 506(c) having an outer contour that forms a conical frustum between the larger diameter of the lower section 506(a) and the smaller diameter of the upper section 506(b).

The upper section 506(b) has a cutout forming a flat surface 508 that faces in a forward direction 510, also referred to as the z direction, relative to the chassis 502. The flat surface 508 has one or more openings to accommodate first lens 512 and second lens 114. The first and second lenses 512 and 514 are mounted so that their principal axes are generally perpendicular to the rotational axis 504, and generally parallel to the forward direction 510. In practice, each of the first and second lenses 512 and 514 may comprise multiple lenses, such as a three element lens or a "triple lens", and may therefore have multiple individual lens elements.

The first and second lenses 512 and 514 have a common field of view of a scene. Rotation of the chassis 502 causes the field of view to move or scan in a scan direction 516, also referred as the x direction, over the scene. In the illustrated example, in which the rotational axis 504 is vertical, the scan direction 516 is horizontal.

The chassis 502 has a partially bisecting internal wall 518 that forms a compartment on each of two lateral sides of the chassis 502. In FIG. 5A, a sensor compartment 520 is shown on one side of the chassis 502. In FIG. 5B, an emitter compartment 522 is shown on the other side of the chassis 502. The sensor compartment 520 houses a light sensor 524. The emitter compartment houses a laser light source 526.

The first lens 512 is generally above the sensor compartment 520 and forward of the light sensor 524. The second lens 514 is generally above the emitter compartment 522 and forward of the laser light source 526.

One or more mirrors 528 are positioned within the chassis 502 behind the first and second lenses 512 and 514 to redirect emitted and received light between different directions, such as horizontal and vertical directions. Received light enters the chassis generally horizontally from the first lens 512 and is redirected downwardly by the one or more mirrors 528 toward the light sensor 524. The laser light source 526 emits laser light in an upward direction. The emitted light hits the one or more mirrors 528 and is redirected horizontally outward, in the forward direction 510 through the second lens 514.

The first lens 512 projects an image onto a sensor frame 530 of the light sensor 524. The sensor frame 530 is an area having an x axis 534 that corresponds optically to the scan direction 516. As the chassis 502 rotates, an image of the scene scans along the x axis 534 of the sensor frame 530. Accordingly, the x axis of the sensor frame 530 may at times be referred to as the scan axis of the sensor frame 530. In the illustrated orientation in which the rotational axis 504 is vertical, the x axis 534 corresponds optically to the horizontal direction of the projected image.

The sensor frame 530 has a y axis 536 that is perpendicular to the x axis. In the illustrated orientation in which the rotational axis 504 is vertical, the y axis 536 of the sensor frame 530 corresponds optically to the vertical direction of the projected image.

Laser emitters within an emitter frame 532 of the light source 526 project laser light through the second lens 514 into the scene. The emitter frame 532 has an x axis 538, also referred to as a scan axis that corresponds optically to the scan direction 516. As the chassis 502 rotates, the projected light scans in the scan direction 516. The emitter frame 532 has a y axis 540 that is perpendicular to the x axis 538. In the illustrated orientation in which the rotational axis 504 is vertical, the x axis 538 of the emitter frame 532 corresponds optically to the horizontal direction of the scene into which the laser light is projected. The y axis 540 of the emitter frame 532 corresponds optically to the vertical direction of the scene into which the laser light is projected.

Generally, the laser light source 526 has multiple laser emitters and the light sensor 524 has multiple corresponding sensor elements. Each laser emitter corresponds to a respective sensor element, and a pair comprising an emitter and a corresponding sensor element is referred to as a channel. The term "channel" may also encompass supporting circuitry that is associated with the emitter/sensor pair. A channel is used to emit a laser light burst and to measure properties of the reflections of the burst, as explained below.

While the examples described herein include a plurality of measurement channels (e.g., 2-100), and accordingly comprise a corresponding number of laser emitters and respectively corresponding light sensors, different examples may use a single channel or a different number of channels depending on desired sensor resolutions and coverage angles, where the coverage angle corresponds to the field of view relative to the horizon.

FIG. 6 illustrates further details regarding the light sensor 524. In some configurations, the light sensor 524 comprises an array of individual sensor elements 602. In certain examples, the sensor elements 602 comprise avalanche photodiodes (APDs).

The sensor elements 602 are mounted on a planar printed circuit board 604. The sensor elements 602 are positioned within the sensor frame 530, which is an area within which the first lens 512 projects an image of an external scene. FIG. 6 shows the x axis 534, which is the axis corresponding to the scan direction 516 of the chassis 502 relative to the scene. The x axis 534, also referred to herein as the scan axis, represents the axis along which an image of the scene is translated as the chassis 502 rotates.

The sensor elements 602 are arranged in multiple parallel rows, with alternate rows being staggered to achieve a higher packing density. Each row extends along a line that is angled with respect to the x axis 534 so that each sensor element 602 is at a different elevation relative to they axis 536, where they axis 536 is orthogonal to the scan axis 534.

FIG. 7 illustrates further details regarding how the sensor elements 602 are packed to achieve a relatively high packing density and correspondingly fine y-axis pitch. In FIG. 7, an area associated with each sensor element 602 is illustrated as a hexagon 702, and the hexagons 702 are packed so that they are adjacent to each other. This is known as hexagonal packing. Each hexagon 702 represents an area that is occupied by a sensor element 602 and any associated circuitry that may be located near the sensor element 602.

Figure 8:
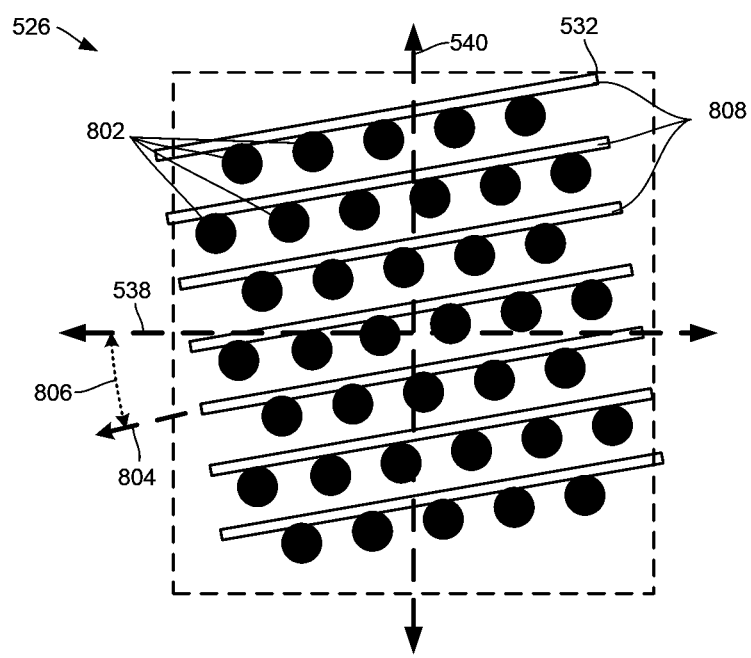
FIG. 8 is a representational top view of an example laser light source that may be used in the LIDAR assembly of FIGS. 5A and 5B.

FIG. 8 illustrates details regarding an example embodiment of the laser light source 104. The laser light source 104 comprises a plurality of individual laser emitters 802, arranged similarly to the sensors as illustrated in FIG. 6. In the described embodiment, the laser emitters comprise injection laser diodes (ILDs).

The laser emitters 802 are positioned within the emitter frame 532, which is an area from which the lens 514 projects. FIG. 8 shows the x axis 538, which is the axis corresponding to the scan direction 516 of the chassis 502 relative to the scene. In this example, the laser emitters 802 are arranged with the same (or substantially similar) spacing as the sensor elements 702. The laser emitters 802 can be mounted along edges of printed circuit boards, also referred to as emitter boards, with each emitter board being used to position a corresponding row of the laser emitters 802.

Figure 9:
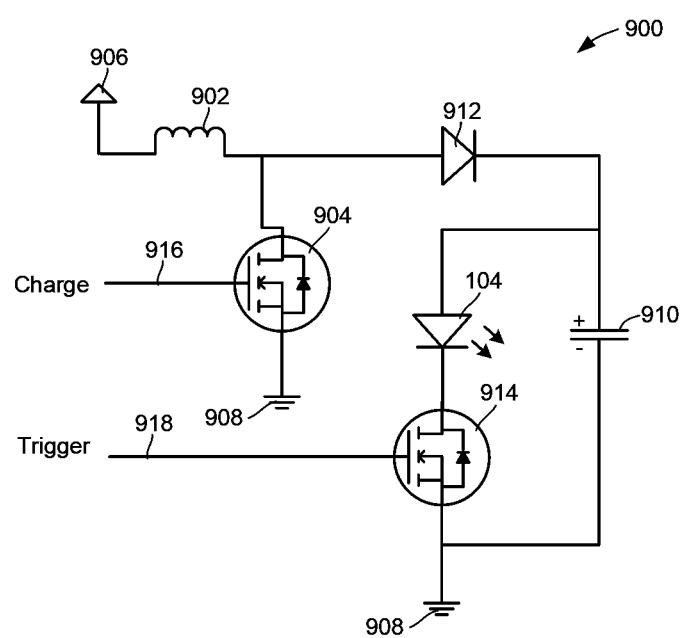
FIG. 9 is a schematic view of an example electrical circuit that may be used in a measurement channel to generate a single laser pulse.

FIG. 9 shows an example electrical circuit 900 for driving a laser light source. In this example, the circuit 900 provides a single emitted light pulse. Other circuit configurations, however, can provide multiple pulses. For example, another circuit (not shown) can be configured to provide two or more emitted light pulses.

The circuit 900 has an inductive boost charging section comprising an inductor 902 and a transistor 904. The transistor 904 may comprise a FET such as a GaN FET. A first terminal of the inductor 902 is connected to a power source 906, which has a positive voltage relative to a ground reference 908. For example, the power source 906 may be a 5-volt DC (direct-current) voltage source. The second terminal of the inductor is connected to the drain of the transistor 904. The source of the transistor 904 is connected to the ground reference 908.

The electrical circuit 900 has an energy storage capacitor 910. The energy storage capacitor 910 is labeled as having a positive (+) terminal and a negative (−) terminal to indicate that during operation of the circuit, the +terminal is charged positively relative to the −terminal.

The energy storage capacitor 910 is connected through a diode 912 to the second terminal of the inductor 902, to be charged with current supplied by the inductor 902. Specifically, the anode of the diode 912 is connected to the second terminal of the inductor 902. The cathode of the diode 912 is connected to the + terminal of the energy storage capacitor 910. The −terminal of the capacitor 910 is connected to the ground reference 908.

The anode of the laser emitter 104 is connected to the + terminal of the energy storage capacitor 910. A transistor 914 is connected between the cathode of the laser emitter 104 and the ground reference 908. Specifically, the drain of the transistor 914 is connected to the cathode of the laser emitter 104 and the drain of the transistor is connected to the ground reference 908.

In operation, the gate of the transistor 904 is connected to a charge signal 916. When the charge signal 916 turns on the transistor 904, current flows from the power source 906, through the inductor 902, through the transistor 904, and to the ground reference 908.

When the current through the inductor 902 is nearly to the saturation point of the inductor 902, the transistor 904 is turned off, and the inductor current then flows to the capacitor 910, charging the + terminal relative to the − terminal.

The gate of the transistor 914 is connected to a trigger signal 918, which is used to turn on the transistor 914 at the appropriate time for emitting a pulse from the laser emitter. Turning on the transistor 914 causes the energy stored by the energy storage capacitor 910 to discharge through the laser emitter 104.

The transistor 914 comprises an n-type GaN FET in this embodiment, although a similar circuit may be implemented for use with any FET with appropriate switching capabilities.

As described above, the charging and triggering of the laser emitter can be at least partially controlled by the controller 112.

Figure 10A:
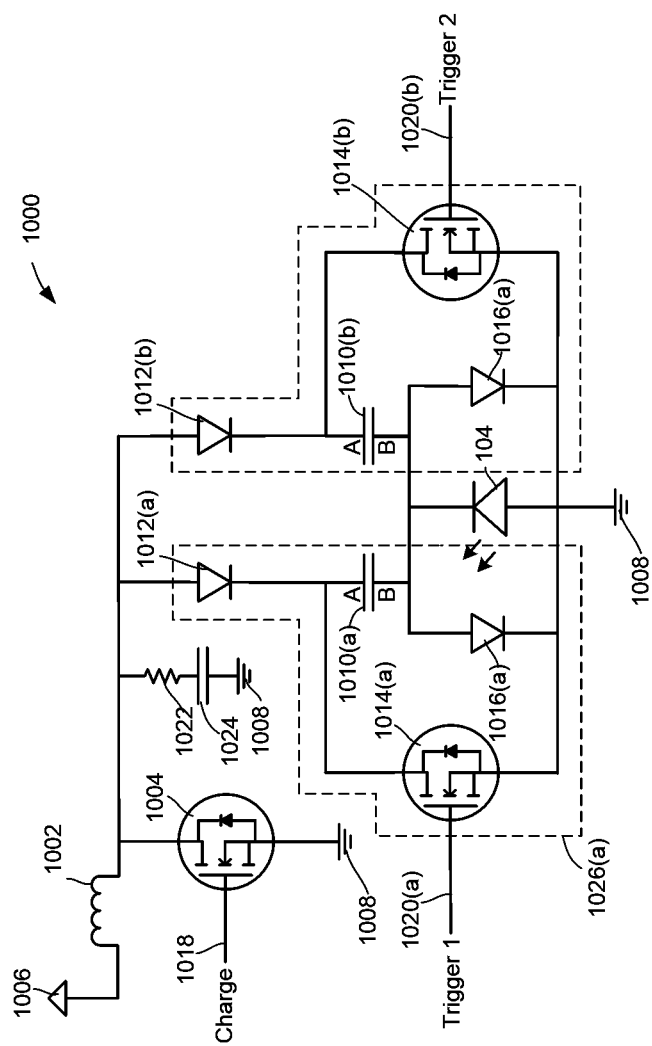
FIG. 10A is a schematic view of an example electrical circuit that may be used in a measurement channel to generate a pair of laser pulses.

FIG. 10A shows an example electrical circuit 1000 for driving an individual laser emitter 104, and in particular for firing on the laser emitter 104 in a burst of two short pulses. In this example, the laser emitter 104 comprises an injection laser diode having an anode and a cathode. Each measurement channel has an instance of the circuit 1000. Note that although the circuit 1000 in this example is configured to produce two pulses, the circuit 1000 can be expanded to produce any number of pulses, and may also be modified to produce only a single pulse.

The circuit 1000 has an inductive boost charging section comprising an inductor 1002 and a transistor 1004. In certain embodiments, the transistor 1004 comprises an FET (field-effect transistor) or enhanced-mode GaN FET (gallium nitride field-effect transistor), referred to as an eGaN FET. A first terminal of the inductor 1002 is connected to a power source 1006, which has a positive voltage relative to a ground reference 1008. For example, the power source 1006 may be a 5-volt DC (direct-current) voltage source. The second terminal of the inductor is connected to the drain of the transistor 1004. The source of the transistor 1004 is connected to the ground reference 1008.

The circuit 1000 has first and second energy storage capacitors 1010(a) and 1010(b), which may in some embodiments comprise non-polarized ceramic capacitors. For purposes of discussion, each of these capacitors is labeled as having an "A" terminal and a "B" terminal. During operation of the circuit, the A terminal is charged positively relative to the B terminal.

The energy storage capacitors 1010(a) and 1010(b) are connected through corresponding blocking diodes 1012(a) and 1012(b) to the second terminal of the inductor 1002, to be charged with current supplied by the inductor 1002. Specifically, the anodes of the blocking diodes 1012(a) and 1012(b) are connected to the second terminal of the inductor 1002. The cathode of the blocking diode 1012(a) is connected to the A terminal of the first energy storage capacitor 1010(a). The cathode of the blocking diode 1012(b) is connected to the A terminal of the second energy storage capacitor 1010(b).

The B terminals of the capacitors 1010(a) and 1010(b) are connected in common to the cathode of the laser emitter 104.

Note that in some cases, the capacitance represented by each of the capacitors 1010(a) and 1010(b) may be provided by multiple capacitors in parallel.

First and second transistors 1014(*a*) and 1014(*b*) are associated respectively with the first and second energy storage capacitors 1010(*a*) and 1010(*b*). In the described embodiment, each of the transistors 1014(*a*) and 1014(*b*) comprises an FET, and in some embodiments may comprise a GaN FET. The drain of the first transistor 1014(*a*) is connected to the A terminal of the first energy storage capacitor 1010(*a*). The drain of the second transistor 1014(*b*) is connected to the A terminal of the second energy storage capacitor 1010(*b*). The sources of the first and second transistors 1014(*a*) and 1014(*b*) are connected to the ground reference 1008. The anode of the laser emitter 104 is also connected to the ground reference 1008.

The circuit 1000 may also have one or more flyback diodes 1016. The anode of each flyback diode 1016 is connected to the cathode of the laser emitter 104. The cathode of each flyback diode 1016 is connected to the anode of the laser emitter 104 and to the ground reference 1008. The flyback diodes limit the negative voltage that can be induced at the anode of the laser emitter 104.

In operation, the gate of the transistor 1004 is connected to a charge signal 1018. When the charge signal 1018 turns on the transistor 1004, current flows from the power source 1006, through the inductor 1002, through the transistor 1004, and to the ground reference 1008.

When the current through the inductor 1002 is nearly to the saturation point of the inductor 1002, the transistor 1004 is turned off, and the inductor current then flows to the capacitors 1010 and positively charges the A terminals relative to the B terminals. The relative voltage to which the capacitors 1010 are charged will be referred to herein as the charge voltage.

In the described embodiments, the transistor 1004 is turned on for approximately 2 microseconds. When the transistor 1004 is turned off, it takes approximately 500 nanoseconds for the capacitors 1010 to charge. The total charging time is thus 2.5 microseconds or greater.

The gate of the first transistor 1014(*a*) is connected to a first trigger signal 1020(*a*), which is used to turn on the first transistor 1014(*a*) when the laser emitter 104 is to emit a first pulse. Turning on the first transistor 1014(*a*) lowers the voltage at the A terminal nearly to the voltage of the ground reference 1008, and accordingly also lowers the voltage of the B terminal by an amount approximately equal to the charge voltage. Accordingly, the cathode of the laser emitter 104 will now be at a negative potential with respect to the anode, and the stored energy of the capacitor is discharged through the laser emitter 104. The resulting current through the laser emitter 104 causes the laser emitter 104 to emit light.

The gate of the second transistor 1014(*b*) is connected to a second trigger signal 1020(*b*). The second trigger signal 1020(*b*) is used to discharge the second capacitor 1010(*b*) through the laser emitter 104 in order to create a second pulse.

In operation, the first transistor 1014(*a*) is turned on to initiate the first pulse of a laser burst, and the second transistor 1014(*b*) is turned on shortly after to initiate the second pulse.

Although the circuit 1000 is shown as using n-type or enhancement mode GaN FETs for the transistors 1014, a similar circuit using p-type or depletion mode GaN FETs may also be used. In addition, the circuit can be expanded to support generation of any number of pulses, for use to sequentially fire any number of laser emitters.

In some embodiments, a snubber can be added to reduce voltage oscillations in drive current that might otherwise occur due to parasitic capacitances and inductances. If such oscillations were allowed to occur, it could become necessary to wait until they were to subside before firing the laser emitter 104. A snubber may comprise a resistor 1022 and a capacitor 1024 connected between the second terminal of the inductor 1002 and the ground reference 1008 to damp any voltage and current oscillations at the second terminal of the inductor 1002.

The circuit 1000 can be modified to produce any number of laser pulses, including a single pulse or more than two pulses. Dashed lines are used in FIG. 10A to indicate components of first and second firing circuits 1026(*a*) and 1026(*b*). These firing circuits can be replicated as needed to create any number of pulses. To create a single drive pulse, a single firing circuit 1026 may be used. To create three drive pulses, three firing circuits 1026 may be used, each connected to the inductor 1002 and the emitter 104 as shown in FIG. 10A.

Figure 10B:
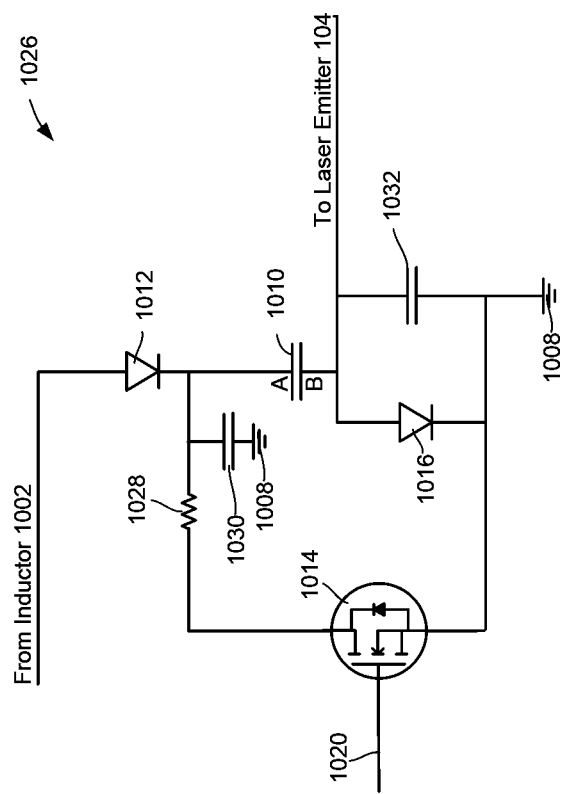
FIG. 10B is a schematic view of a trigger circuit that may be used in a measurement channel to fire a laser emitter.

FIG. 10B illustrates additional elements that may be used in some embodiments of a firing circuit 1026 such as shown in FIG. 10A.

Parasitic capacitances and inductances associated with the transistor 1014 and its associated components and interconnections may in certain situations limit the shortness of the pulse generated by the firing circuit 1026, and it may be desired to produce a shorter pulse than would otherwise be possible. In these situations, a relatively small resistance 1028 may be placed between the A terminal of the energy storage capacitor 1010 and the drain of the transistor 1014. In combination with parasitic capacitances and inductances, the resistance 1028 creates a resonance such that the voltage at the A terminal of the capacitor 1010 oscillates to produce an initial current pulse that is shorter than would otherwise occur. In some embodiments, a capacitance 1030 may also be added between the A terminal of the capacitor 1010 and the ground reference 1008 to enhance or further tune this effect. In some embodiments, a capacitance 1032 may similarly be added between the B terminal of the capacitor 1010 and the ground reference 1008 to further enhance this effect. The values of the added resistances and capacitances are calculated or determined based on the characteristics of the specific implementation in order to achieve a desired initial pulse duration.

In some cases, the transistor 1014 may be duplicated, so that two such transistors are used in parallel to drive the current from the energy storage capacitor 1010. Using two transistors in parallel may reduce the effects of parasitic inductances and capacitances.

Although the discussion above sets forth example implementations of the described techniques, other architectures may be used to implement the described functionality, and are intended to be within the scope of this disclosure. Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

The invention claimed is:

1. A system, comprising:
   a laser light source to emit emitted light;
   a light sensor that produces light signals in response to sensing reflected light associated with the emitted light; and
   a controller communicatively coupled to the laser light source, the controller being operative to:

cause a charge circuit to charge for a charge duration to emit the emitted light;

sense the reflected light associated with the emitted light; and store an association between the charge duration and a property of the reflected light in a profile.

2. The system of claim 1, wherein the emitted light comprises a first light pulse, the reflected light comprises a first reflected pulse, and the controller is further operative to:

cause the charge circuit to charge for the charge duration to emit a second light pulse; and sense a second reflected pulse associated with the second light pulse, wherein the association is based at least in part on a first power value associated with the first reflected pulse and a second power value associated with the second reflected pulse.

3. The system of claim 2, wherein the association comprises an average power value determined based at least in part on the first power value and the second power value.

4. The system of claim 3, wherein the average power value is determined by dividing a total power emitted by the laser light source by a number of light pulses emitted by the laser light source at the charge duration.

5. The system of claim 1, wherein the charge duration comprises a first charge duration, the emitted light comprises a first light pulse, the reflected light comprises a first reflected pulse, and the controller is further operative to:

cause the charge circuit to charge for a second charge duration, different than the first charge duration, to emit a second light pulse;

sense a second reflected pulse associated with the second light pulse; and store an additional association of the second charge duration and a property of the second reflected pulse in the profile.

6. The system of claim 1, wherein:

the laser light source comprises a first laser light source, the charge duration comprises a first charge duration, the emitted light comprises a first light pulse, the reflected light comprises a first reflected pulse, and the profile comprises a first profile, the system further comprises a second laser light source, and the controller is further operative to store a second charge duration and a second power value associated with a second reflected pulse in a second profile associated with the second laser light source.

7. The system of claim 1, wherein the emitted light is emitted by the laser light source and reflected by a reference surface spaced a distance from the light sensor, the reference surface having known reflective properties.

8. The system of claim 1, wherein the charge circuit comprises one or more capacitors that are charged for the charge duration to drive the laser light source.

9. One or more non-transitory computer-readable media storing instructions that, when executed, cause one or more processors to perform operations comprising:

causing a charge circuit included in an electrical circuit to charge for a specified charge duration to emit emitted light;

sensing, using a light sensor, reflected light associated with the emitted light; and storing an association between the specified charge duration and a property of the reflected light in a profile.

10. The one or more non-transitory computer-readable media of claim 9, wherein the emitted light comprises a first light pulse emitted by a laser light source, the reflected light comprises a first reflected pulse, and the operations further comprise:

causing the charge circuit to charge for the specified charge duration to emit a second light pulse via the laser light source; and sensing a second reflected pulse associated with the second light pulse, wherein the association is based at least in part on a first power value associated with the first reflected pulse and a second power value associated with the second reflected pulse and comprises an average power value determined based at least in part on the first power value and the second power value, wherein the average power value is determined by dividing a total power emitted by the laser light source by a number of light pulses emitted by the laser light source at the specified charge duration.

11. The one or more non-transitory computer-readable media of claim 9, wherein the specified charge duration comprises a first charge duration, the emitted light comprises a first light pulse, the reflected light comprises a first reflected pulse, and the operations further comprise:

causing the charge circuit to charge for a second charge duration, different than the first charge duration, to emit a second light pulse;

sensing a second reflected pulse associated with the second light pulse; and storing an additional association of the second charge duration and a property of the second reflected pulse in the profile.

12. The one or more non-transitory computer-readable media of claim 9, wherein:

the specified charge duration comprises a first charge duration, the emitted light comprises a first emitted light, the reflected light comprises a first reflected light, and the profile comprises a first profile associated with a first laser light source, and the operations further comprise storing a second charge duration and a second power value associated with a second reflected pulse in a second profile associated with a second laser light source.

13. The one or more non-transitory computer-readable media of claim 9, wherein the emitted light is emitted by a laser light source and reflected by a reference surface spaced a distance from the light sensor, the reference surface having known reflective properties.

14. The one or more non-transitory computer-readable media of claim 9, wherein the charge circuit comprises one or more capacitors that are charged for the specified charge duration to drive a laser light source.

15. A method, comprising:

causing a charge circuit included in an electrical circuit to charge for a specified charge duration to emit emitted light;

sensing, using a light sensor, reflected light associated with the emitted light; and storing an association between the specified charge duration and a property of the reflected light in a profile.

16. The method of claim 15, wherein the emitted light comprises a first light pulse emitted by a laser light source, the reflected light comprises a first reflected pulse, and the method further comprises:

causing the charge circuit to charge for the specified charge duration to emit a second light pulse via the laser light source; and sensing a second reflected pulse associated with the second light pulse, wherein the association is based at least in part on a first power value associated with the first reflected pulse and a second power value associated with the second reflected pulse and comprises an average power value determined based at least in part on the first power value and the second power value, wherein the average power value is determined by dividing a total power emitted by the laser light source by a number of light pulses emitted by the laser light source at the specified charge duration.

17. The method of claim 15, wherein the specified charge duration comprises a first charge duration, the emitted light comprises a first light pulse, the reflected light comprises a first reflected pulse, and the method further comprises:

causing the charge circuit to charge for a second charge duration, different than the first charge duration, to emit a second light pulse;

sensing a second reflected pulse associated with the second light pulse; and storing an additional association of the second charge duration and a property of the second reflected pulse in the profile.

18. The method of claim 15, wherein:

the specified charge duration comprises a first charge duration, the emitted light comprises a first emitted light, the reflected light comprises a first reflected light, and the profile comprises a first profile associated with a first laser light source, and the method further comprises:

storing a second charge duration and a second power value associated with a second reflected pulse in a second profile associated with a second laser light source.

19. The method of claim 15, wherein the emitted light is emitted by a laser light source and reflected by a reference surface spaced a distance from the light sensor, the reference surface having known reflective properties.

20. The method of claim 15, wherein the charge circuit comprises one or more capacitors that are charged for the specified charge duration to drive a laser light source.

* * * * *

UNITED STATES PATENT AND TRADEMARK OFFICE
CERTIFICATE OF CORRECTION

| | |
|---|---|
| PATENT NO. | : 11,231,490 B2 |
| APPLICATION NO. | : 16/947137 |
| DATED | : January 25, 2022 |
| INVENTOR(S) | : Adam Berger et al. |

It is certified that error appears in the above-identified patent and that said Letters Patent is hereby corrected as shown below:

On the Title Page

Item (54) and in the Specification, Column 1, Line 1, Change "CAILIBRATION" to --CALIBRATION--.

Signed and Sealed this
Fourteenth Day of June, 2022

Katherine Kelly Vidal
*Director of the United States Patent and Trademark Office*